(12) United States Patent
Li et al.

(10) Patent No.: US 11,973,484 B2
(45) Date of Patent: Apr. 30, 2024

(54) ACOUSTIC RESONATOR WITH REINFORCING STRUCTURE AND MANUFACTURING METHOD THEREFOR

(71) Applicant: HANGZHOU XINGHE TECHNOLOGY CO., LTD., Zhejiang (CN)

(72) Inventors: Linping Li, Zhejiang (CN); Jinghao Sheng, Zhejiang (CN); Zhou Jiang, Zhejiang (CN)

(73) Assignee: HANGZHOU XINGHE TECHNOLOGY CO., LTD. (CN)

( * ) Notice: Subject to any disclaimer, the term of this patent is extended or adjusted under 35 U.S.C. 154(b) by 0 days.

(21) Appl. No.: 18/084,400

(22) Filed: Dec. 19, 2022

(65) Prior Publication Data

US 2023/0216472 A1 Jul. 6, 2023

(30) Foreign Application Priority Data

Dec. 31, 2021 (CN) .......................... 202111659817.6

(51) Int. Cl.
*H03H 9/02* (2006.01)
*H03H 3/02* (2006.01)
(Continued)

(52) U.S. Cl.
CPC .......... *H03H 9/02133* (2013.01); *H03H 3/02* (2013.01); *H03H 9/02157* (2013.01);
(Continued)

(58) Field of Classification Search
CPC .. H03H 9/02133; H03H 9/02157; H03H 9/13; H03H 9/173
See application file for complete search history.

(56) References Cited

U.S. PATENT DOCUMENTS

| 5,714,917 A | 2/1998 | Ella |
| 9,893,270 B2 | 2/2018 | Araki et al. |
| (Continued) | | |

FOREIGN PATENT DOCUMENTS

| CN | 102315830 | 1/2012 |
| CN | 102931941 | 2/2013 |
| (Continued) | | |

OTHER PUBLICATIONS

English Translation of JP 2010154233 (Year: 2010).*
(Continued)

*Primary Examiner* — Bryan P Gordon
(74) *Attorney, Agent, or Firm* — The Belles Group, P.C.

(57) ABSTRACT

An acoustic resonator with a reinforcing structure is provided according to the present disclosure. The acoustic resonator includes a substrate and a cavity formed on the substrate, a piezoelectric layer is arranged above the substrate and an opening passing through the piezoelectric layer is formed in a peripheral region of the piezoelectric layer. The reinforcing structure includes a reinforcing layer, part of the reinforcing layer is formed at the edge of the opening with being fitted to the edge, to reinforce a resonant functional layer near the edge of the opening, which can reduce a change in stress of the piezoelectric layer and the lower electrode near the edge of the opening after the cavity is released, so that the piezoelectric layer and the lower electrode do not easily collapse due to stress, thereby ensuring the performance of a device. A method for manufacturing the same is further provided.

20 Claims, 10 Drawing Sheets

A-A'

(51) Int. Cl.
*H03H 9/13* (2006.01)
*H03H 9/17* (2006.01)

(52) U.S. Cl.
CPC .............. *H03H 9/13* (2013.01); *H03H 9/173* (2013.01); *H03H 2003/021* (2013.01)

(56) References Cited

U.S. PATENT DOCUMENTS

| | | |
|---|---|---|
| 10,511,285 B1 | 12/2019 | Patil |
| 2006/0284706 A1 | 12/2006 | Ginsburg et al. |
| 2014/0354110 A1* | 12/2014 | Araki .................. H10N 30/074 310/311 |
| 2017/0033763 A1* | 2/2017 | Hira .................. H03H 9/02897 |
| 2017/0310299 A1* | 10/2017 | Bower .................. H03H 9/545 |
| 2018/0062608 A1* | 3/2018 | Lee .................. H03H 9/02157 |
| 2018/0234075 A1* | 8/2018 | Lee .......................... H03H 9/13 |
| 2021/0159876 A1* | 5/2021 | Maki .................. H03H 9/0561 |
| 2023/0106579 A1 | 4/2023 | Hino et al. |

FOREIGN PATENT DOCUMENTS

| | | |
|---|---|---|
| CN | 111294010 | 6/2020 |
| CN | 111294010 A | 6/2020 |
| CN | 111342809 | 6/2020 |
| EP | 0834989 A2 | 4/1998 |
| JP | 2010154233 A | 7/2010 |
| WO | 2013125371 A1 | 7/2015 |
| WO | WO2015159465 | 10/2015 |
| WO | 2021159677 A1 | 8/2021 |
| WO | 2021246443 A1 | 12/2021 |

OTHER PUBLICATIONS

Office Action issued in corresponding Japanese Patent Application 2022-210465, dated May 8, 2023.

Search Report issued in counterpart European Application No. 22214051.9 on Oct. 25, 2023.

* cited by examiner

A-A'

B-B'

ACOUSTIC RESONATOR WITH REINFORCING STRUCTURE AND MANUFACTURING METHOD THEREFOR

CROSS REFERENCE OF RELATED APPLICATION

This application claims the priority to Chinese Patent Application No. 202111659817.6 titled "ACOUSTIC RESONATOR WITH REINFORCING STRUCTURE AND MANUFACTURING METHOD THEREFOR", filed on Dec. 31, 2021 with the China National Intellectual Property Administration, which is incorporated herein by reference in its entirety.

FIELD

The present application relates to the technical field of bulk acoustic resonators, in particular to an acoustic resonator with a reinforcing structure and a manufacturing method therefor.

BACKGROUND

Film Bulk Acoustic Resonators have a sandwiched structure including an electrode, a piezoelectric film and an electrode, where a layer of piezoelectric material is sandwiched between two metallic electrode layers. With an electrical signal being inputted between the two electrode layers, the input electrical signal is converted into a mechanical resonant wave through the piezoelectric film by using an inverse piezoelectric effect, and the mechanical resonant wave is converted into an electrical signal by using a piezoelectric effect to be outputted. For most of resonators, the acoustic wave is limited in a piezoelectric oscillation stack by using a cavity structure.

In the conventional technology, any one or more layers of a piezoelectric layer and a lower electrode are required to be etched to form a release hole for the sacrificial material to be released. However, etching causes damage to the piezoelectric layer and the lower electrode, and in a case that the sacrificial material is released, the damaged piezoelectric layer and the lower electrode easily collapse due to stress, thereby affecting the performance of the resonator.

SUMMARY

An acoustic resonator with a reinforcing structure and a method for manufacturing the same are provided according to the present disclosure, in order to solve the above technical problem that a piezoelectric oscillation stack above an edge of a cavity easily collapses and deforms with a poor mechanical strength.

An acoustic resonator with a reinforcing structure is provided according to a first aspect of the present disclosure. The acoustic resonator includes a substrate and a resonant functional layer formed above the substrate. The resonant functional layer includes a lower electrode, an upper electrode and a piezoelectric layer, where a cavity is formed between the lower electrode and the substrate; the upper electrode is arranged above the lower electrode; and the piezoelectric layer is arranged between the lower electrode and the upper electrode, where an opening passing through the piezoelectric layer is formed in a peripheral area of the piezoelectric layer, and part of the opening is in communication with the cavity. The reinforcing structure includes a reinforcing layer, and part of the reinforcing layer is formed at an edge of the opening with being fitted to the edge, to reinforce the resonant functional layer near the edge of the opening.

With the above technical solution, since the reinforcing structure includes the reinforcing layer, and part of the reinforcing layer is formed at the edge of the opening with being fitted to the edge, the reinforcing layer reinforces the piezoelectric layer and the lower electrode near the edge of the opening, which can reduce a change in stress of the piezoelectric layer and the lower electrode near the edge of the opening after the cavity is released, so that the piezoelectric layer and the lower electrode do not easily collapse due to stress, thereby improving the uniformity and yield of the acoustic resonator and ensuring the designed performance of a device.

In an embodiment, an edge of the lower electrode is exposed in the opening and the reinforcing layer is in contact with part of the lower electrode exposed in the opening.

With the above technical solution, since the edge of the lower electrode is exposed in the opening, and the reinforcing layer is in contact with part of the lower electrode exposed in the opening, the reinforcing layer and the lower electrode form an integrated structure to support the lower electrode.

In an embodiment, the reinforcing layer extends onto an upper surface of the piezoelectric layer from the edge of the opening.

With the above technical solution, the reinforcing layer may be further extended onto the upper surface of the piezoelectric layer, thereby forming a structure arranged on the piezoelectric layer, which further ensures the reinforcing effect of the reinforcing layer on the resonant functional layer near the opening.

In an embodiment, an extended part of the reinforcing layer is spanned on the piezoelectric layer on at least two sides of the opening.

With the above technical solution, since the extended part of the reinforcing layer is spanned on the piezoelectric layer on two sides of the opening, the reinforcing layer is supported on the piezoelectric layer on two sides of the opening, and then the reinforcing layer can better support the resonant functional layer near the edge of the opening.

In an embodiment, an extended part of the reinforcing layer extends, towards a center of the resonator, onto the piezoelectric layer from the edge of the opening.

With the above technical solution, since the extended part of the reinforcing layer extends, toward the center of the resonator, onto the piezoelectric layer from the edge of the opening, the piezoelectric layer in the central region of the resonator serves as a support area of the reinforcing layer, and then the reinforcing layer supports the resonant functional layer near the edge of the opening, so that the resonant functional layer does not easily collapse due to stress.

In an embodiment, the reinforcing layer covers the part of the lower electrode exposed in the opening.

With the above technical solution, since the reinforcing layer covers the part of the lower electrode exposed in the opening, the reinforcing layer reinforces the exposed part of the lower electrode, and then the lower electrode does not easily collapse due to stress.

In an embodiment, the reinforcing layer is made of a metallic material or a non-metallic material.

With the above technical solution, since the reinforcing layer mainly acts to reinforce, the reinforcing layer made of the metallic material can be better connected with the lower electrode, to form an integrated structure to a certain extent.

In an embodiment, the reinforcing layer is made of one or more of tungsten, iridium, molybdenum, titanium, chromium, copper, magnesium, silver, aluminium, gold or ruthenium.

With the above technical solution, the reinforcing layer made of the above single metal or alloy has high hardness, which allows the reinforcing layer to have a superior reinforcing effect, and the above material is preferably a material for the electrode. If the material of the reinforcing layer is the same as that of the electrode, the reinforcing layer and the upper electrode may be manufactured simultaneously in the same process step, to save costs.

In an embodiment, the reinforcing layer and the upper electrode are separated from each other without electrical connection between the reinforcing layer and the upper electrode.

With the above technical solution, in a case that the reinforcing layer is in contact with the lower electrode and there exists an electrical connection between the reinforcing layer and the upper electrode, the upper electrode and the lower electrode are directly connected, thereby rendering the acoustic resonator disabled.

In an embodiment, a gap at least greater than 2 microns exists between the reinforcing layer and an edge of the upper electrode.

With the above technical solution, the gap of 2 microns or more is provided between the piezoelectric layer and the upper electrode, which allows the upper electrode and the reinforcing layer to be separated completely, thereby not affecting the performance of the resonator.

In an embodiment, the reinforcing layer has a polygonal shape in cross-section in a direction parallel to a surface of the substrate.

With the above technical solution, since the reinforcing layer has a polygonal shape in the cross-section in the direction parallel to the surface of the substrate, the strength of overall mechanical structure of the resonant functional layer near the edge of the opening is further enhanced.

In an embodiment, at least one side of the cavity is provided with a release channel in communication with the cavity, a release hole is formed where the opening is in communication with the release channel, and the reinforcing layer surrounds the release hole.

With the above technical solution, the strength of overall mechanical structure around the release hole and the release channel is further reinforced by the reinforcing layer surrounding an aperture of the release hole.

In an embodiment, the reinforcing layer includes a laminated double-layered structure.

With the above technical solution, the reinforcing layer is formed in a laminated double-layered structure, which enhances the stability of the reinforcing layer, thereby improving the stability of the resonator.

In an embodiment, at least one layer of the double-layered structure is made of a material with high hardness.

With the above technical solution, one or both of the layers of the double-layered structure are made of the material with high hardness, which further enhances the stabilizing and supporting effects of the reinforcing layer.

In an embodiment, a passivation layer is covered on the reinforcing layer and the upper electrode, and the passivation layer covers a gap between the reinforcing layer and the upper electrode.

With the above technical solution, the reinforcing layer and the upper electrode may be protected by adding the passivation layer on the reinforcing layer.

In an embodiment, a projection of at least one corner of the release channel in a direction perpendicular to a surface of the substrate is obtuse or arc-shaped.

With the above technical solution, some or all of the corners of the release channel are obtuse or arc-shaped, which can reduce additional stresses generated in the corners, thereby reducing the effect of a change in stress of the corners on a change in stress of the piezoelectric layer.

A method for manufacturing an acoustic device with a reinforcing structure is further provided according to a second aspect of the present disclosure. The method includes:

providing a substrate;

manufacturing, on the substrate, a sacrificial layer for forming a cavity;

forming a lower electrode and a piezoelectric layer in sequence on the substrate with the sacrificial layer;

forming an opening in the piezoelectric layer to expose part of the lower electrode, wherein the opening is in communication with the sacrificial layer;

manufacturing an upper electrode and a reinforcing layer on the piezoelectric layer, where part of the reinforcing layer is formed at an edge of the opening with being fitted to the edge, to reinforce a resonant functional layer near the edge of the opening; and releasing the sacrificial layer to form the cavity.

With the above technical solution, by manufacturing the upper electrode and the reinforcing layer above the piezoelectric layer and making the reinforcing layer cover the part of the lower electrode exposed in the opening, the reinforcing layer reinforces the piezoelectric layer and the lower electrode near the edge of the opening, which can reduce a change in stress of the piezoelectric layer and the lower electrode near the edge of the opening after the cavity is released, such that the piezoelectric layer and the lower electrode do not easily collapse due to stress, which improves the uniformity and yield of the acoustic resonator. With the manufacturing method, the upper electrode and the reinforcing layer are formed in an integrated structure, the manufactured reinforcing layer not only has an effect that the piezoelectric layer and the lower electrode do not easily collapse due to stress, but also has an effect that the reinforcing layer is manufactured in a simple and efficient way.

In an embodiment, part of an edge of the lower electrode is exposed in the opening and the reinforcing layer covers the edge of the lower electrode.

With the above technical solution, the reinforcing layer and the lower electrode form an integrated structure to support the lower electrode.

In an embodiment, part of the reinforcing layer further covers part of the piezoelectric layer.

With the above technical solution, the reinforcing layer may be further extended to cover the piezoelectric layer, thereby forming a structure arranged on the piezoelectric layer, which further ensures the reinforcing effect of the reinforcing layer on the resonant functional layer near the opening.

In an embodiment, the reinforcing layer and the upper electrode are formed simultaneously using a metallic material, and the reinforcing layer and the upper electrode are separated from each other.

With the above technical solution, since the reinforcing layer and the upper electrode are formed simultaneously, the reinforcing layer may be manufactured simultaneously while the upper electrode is manufactured for the acoustic resonator, thereby allowing the manufacturing process of the reinforcing layer to be simple and efficient.

An acoustic resonator with a reinforcing structure is provided according to the present disclosure. The reinforcing structure includes a reinforcing layer, part of the reinforcing layer is formed at the edge of the opening with being fitted to the edge, to reinforce the piezoelectric layer and the lower electrode near the edge of the opening, which can reduce a change in stress of the piezoelectric layer and the lower electrode near the edge of the opening after the cavity is released, so that the piezoelectric layer and the lower electrode do not easily collapse due to stress, thereby improving the uniformity and yield of the acoustic resonator and ensuring the designed performance of the device. A method for manufacturing an acoustic device with a reinforcing structure is further provided according to the present disclosure. With the method, the upper electrode and the reinforcing layer are formed simultaneously, and the manufactured reinforcing layer not only has an effect that the piezoelectric layer and the lower electrode do not easily collapse due to stress, but also has an effect that the reinforcing layer is manufactured in a simple and efficient way.

BRIEF DESCRIPTION OF THE DRAWINGS

The accompanying drawings are included to provide a further understanding of the embodiments and are incorporated into and constitute a part of this specification. The drawings are used to illustrate embodiments and explain the principles of the present disclosure together with the description. In this way, many expected advantages of other embodiments and this embodiment may be easily recognized, since they may be better understood by referring to the following detailed description. The elements of the drawings are not necessarily to scale to each other. The same reference numerals refer to corresponding similar parts.

Figure 1:
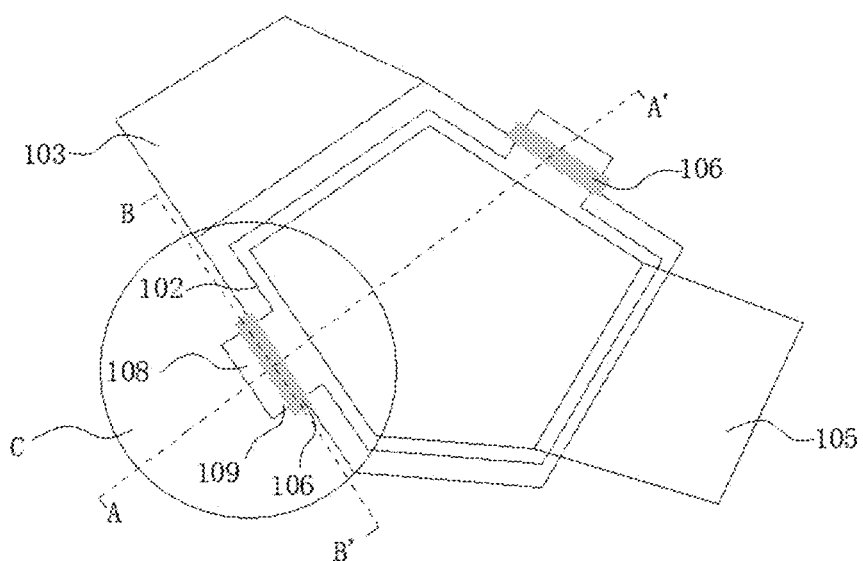
FIG. 1 is a top view of an acoustic resonator with a reinforcing structure according to an embodiment of the present disclosure.

Description of reference numerals:

101 substrate; 102 sacrificial layer; 103 lower electrode;
104 piezoelectric layer; 105 upper electrode;
106 reinforcing layer; 107 passivation layer;
108 release hole; 109 release channel; 110 cavity.

DETAILED DESCRIPTION OF THE EMBODIMENTS

In order to enable objects, technical solutions and advantages of the present disclosure to be more clear, the present disclosure is further described in detailed below in conjunction with the drawings. It is apparent that, the described embodiments are only some embodiments of the present disclosure, rather than all embodiments. All the other embodiments obtained by those skilled in the art based on the embodiments of the present disclosure without creative efforts will fall within the scope of protection of the present disclosure.

Figure 18:
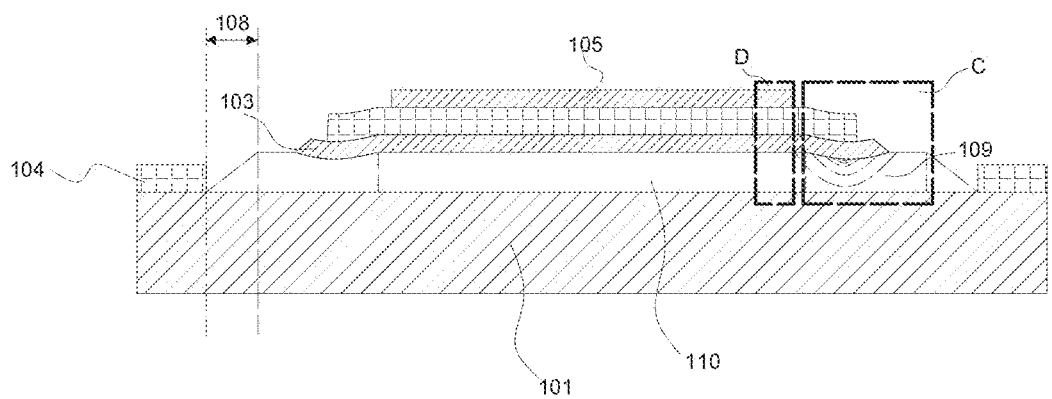
FIG. 18 is a schematic view illustrating the structure of an acoustic resonator in the conventional technology.

In the conventional technology, for a resonator structure as shown in FIG. 18, a lower electrode 103 is raised upwards to form a cavity 110, a piezoelectric layer 104 is etched to form a release hole 108, and a release channel 109 extends outwards from the inside of the cavity 110. In an area C shown in a dashed box, the electrode above the release channel 109 is completely suspended and unsupported, and an oscillation stack above the release channel 109 easily collapses and deforms with a poor mechanical strength, and the area C then affects the performance of an adjacent effective region, i.e. a region D, resulting in the damage to the uniformity of the performance of the piezoelectric film in the effective region. The acoustic resonator and the method for manufacturing the same are improved in the present disclosure.

Figure 2:
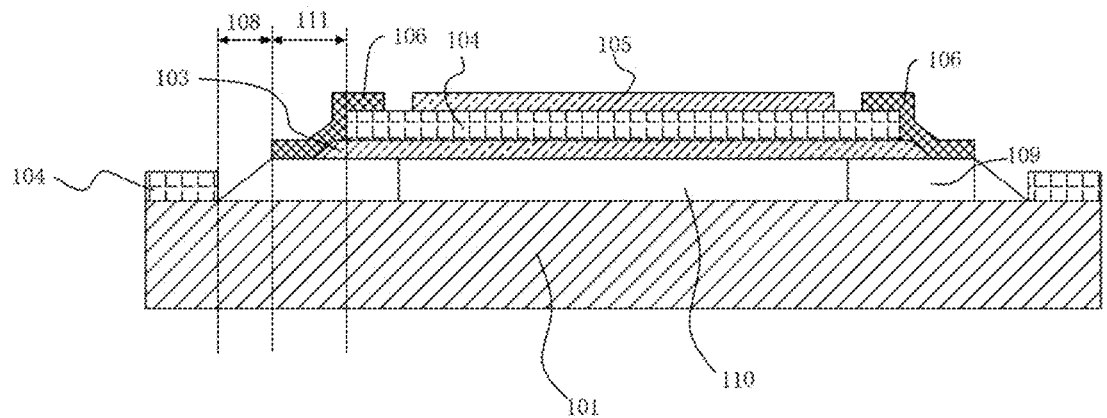
FIG. 2 is a schematic cross-sectional view of an acoustic resonator along an A-A' direction in FIG. 1.

FIG. 1 is a top view of an acoustic resonator with a reinforcing structure according to an embodiment of the present disclosure, and FIG. 2 is a cross-sectional view of an acoustic resonator along an A-A' direction in FIG. 1. With reference to FIG. 1 and FIG. 2 in combination, the acoustic resonator specifically includes a substrate 101 and a resonant functional layer formed above the substrate 101.

The resonant functional layer includes a lower electrode 103, an upper electrode 105 and a piezoelectric layer 104, where a cavity 110 is formed between the lower electrode 103 and the substrate 101, the upper electrode 105 is arranged above the lower electrode 103, the piezoelectric layer 104 is arranged between the lower electrode 103 and the upper electrode 105, and openings 111 and 108 passing through the piezoelectric layer 104 are formed in a peripheral area of the piezoelectric layer 104, and part of the opening is in communication with the cavity 110. It can be seen part of the opening is in communication with the outside to form a release hole 108. The acoustic resonator is further provided with a release channel 109, and the release hole 108 is in communication with the cavity 110 through the release channel 109 to facilitate the release of a sacrificial material in the cavity 110.

Part of a reinforcing layer 106 is formed at an edge of the opening 111 with being fitted to the edge, to reinforce the resonant functional layer near the edge of the opening 111. In an specific example, the reinforcing layer 106 reinforces the piezoelectric layer 104 and the lower electrode 103 near the edge of the opening 111, which can reduce a change in stress of the piezoelectric layer 104 and the lower electrode 103 near the edge of the opening 111 after the cavity 110 is released, so that the piezoelectric layer 104 and the lower electrode 103 do not easily collapse due to stress, thereby improving the uniformity and yield of the acoustic resonator.

An edge of the lower electrode 103 is exposed in the opening 111 and the reinforcing layer 106 is in contact with part of the lower electrode 103 exposed in the opening 111. Furthermore, the reinforcing layer 106 covers the part, exposed in the opening 111, of the lower electrode 103. Since the edge of the lower electrode 103 is exposed in the opening 111 and the reinforcing layer 106 is in contact with the part of the lower electrode 103 exposed in the opening 111, the reinforcing layer 106 and the lower electrode 103 form an integrated structure to support the lower electrode 103. Furthermore, since the reinforcing layer 106 covers the part, exposed in the opening 111, of the lower electrode 103, the reinforcing layer 106 reinforces the part of the lower electrode 103 exposed in the opening 111, such that the lower electrode 103 does not easily collapse due to stress.

In addition, as can be seen in FIG. 2, part of the reinforcing layer 106 (together with the lower electrode 103) substantially forms an upper surface of the release channel 109. As a result, an opening of an edge of an effective resonant region of each of the lower electrode 103 and the piezoelectric layer 104 is reinforced by the reinforcing layer 106, thereby significantly reducing the risk of collapse.

The reinforcing layer 106 and the upper electrode 105 are separated from each other without an electrical connection therebetween. In a case that the reinforcing layer 106 is in contact with the lower electrode 103 and there exists an electrical connection between the reinforcing layer 106 and the upper electrode 105, the upper electrode 105 and the lower electrode 103 are directly connected, thereby rendering the acoustic resonator disabled. In a specific example, a gap greater than 2 microns exists between the reinforcing layer 106 and an edge of the upper electrode 105, which allows the upper electrode 105 and the reinforcing layer 106 to be separated completely, thereby not affecting the performance of the resonator.

In a specific embodiment, as shown in FIG. 2, an extended part of the reinforcing layer 106 may extend, towards a center of the resonator, onto the piezoelectric layer 104 from the edge of the opening 111, and the reinforcing layer 106 extends onto the upper surface of the piezoelectric layer 104 from the edge of the opening 111, thereby forming a structure arranged on the piezoelectric layer 104, which further ensures the reinforcing effect of the reinforcing layer 106 on the resonant functional layer near the opening. Since the stress on the upper surface of the piezoelectric layer 104 varies to a relatively large extent after the cavity 110 is released, the reinforcing layer 106 extends onto the upper surface of the piezoelectric layer 104 from the edge of the opening 111, which further allows the piezoelectric layer 104 to not easily collapse due to stress.

Figure 3:
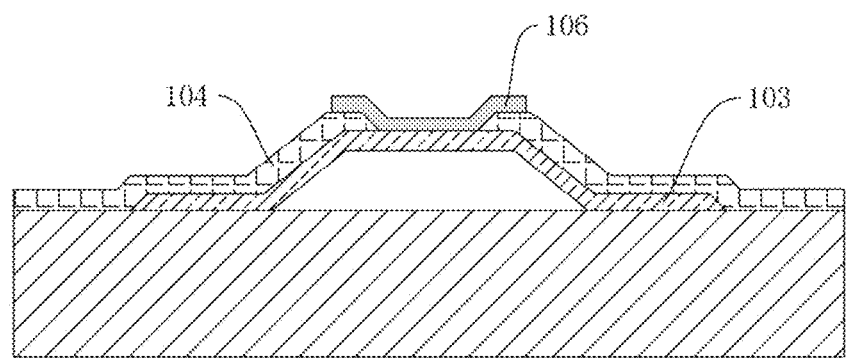
FIG. 3 is a schematic cross-sectional view of an acoustic resonator along a B-B' direction in FIG. 1.

In a specific embodiment, as shown in FIG. 3, the extended part of the reinforcing layer 106 is spanned on the piezoelectric layer 104 on two sides of the opening 111, so that the reinforcing layer 106 is supported on the piezoelectric layer 104 on two sides of the opening 111, which further allows the reinforcing layer 106 to support the resonant functional layer near the edge of the opening 111 and further allows the resonant functional layer to not easily collapse due to stress.

Figure 4:
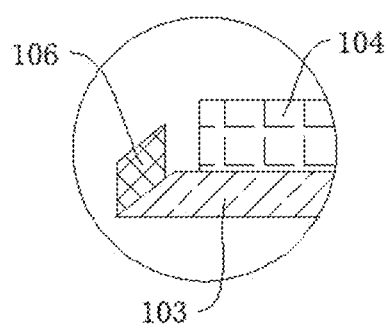
FIG. 4 is an enlarged schematic view illustrating the structure of part of a reinforcing layer in an opening area according to an embodiment of the present disclosure.
Figure 5:
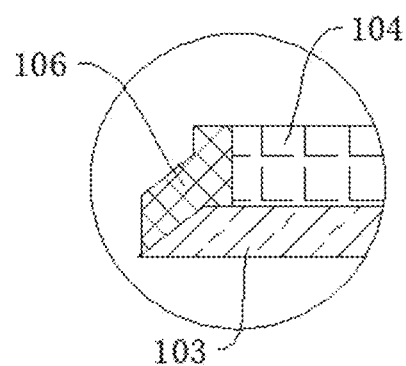
FIG. 5 is an enlarged schematic view illustrating the structure of part of a reinforcing layer in an opening area according to an embodiment of the present disclosure.

In an example, in a case that the extended part is spanned on the piezoelectric layer 104 on two sides of the opening 111 as shown in FIG. 3, the reinforcing layer 106 may only be in contact with the lower electrode 103, and not contact with the piezoelectric layer 104 at a part (i.e. a right-side long edge part of a grey area 106 shown in FIG. 1 or a part corresponding to the right side of the opening 111 shown in FIG. 2) extending towards the center of the resonator (as shown in enlarged FIG. 4). Alternatively, the reinforcing layer 106 may be in contact with the lower electrode 103 and fitted to the piezoelectric layer 104 at the part extending towards the center of the resonator (as shown in enlarged FIG. 5).

Figure 6:
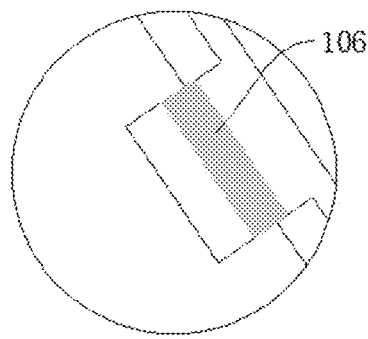
FIG. 6 is an enlarged schematic view of a reinforcing layer in a top view of an acoustic resonator according to an embodiment of the present disclosure.
Figure 7:
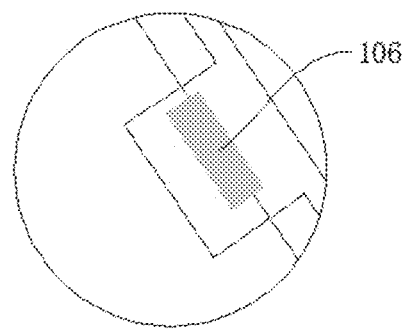
FIG. 7 is an enlarged schematic view of a reinforcing layer in a top view of an acoustic resonator according to an embodiment of the present disclosure.

In different embodiments, as shown in FIGS. 6 and 7, the reinforcing layer 106 may only be in contact with the piezoelectric layer 104 and the lower electrode 103 and is not spanned. In this case, the reinforcing layer 106 preferably creeps (extends) inwards onto the piezoelectric layer 104 in the effective resonant region, as shown in FIG. 2.

In a further embodiment, the reinforcing layer 106 is made of a metallic material. Since the reinforcing layer 106 mainly acts to reinforce, the reinforcing layer 106 made of a metallic material has a better reinforcing effect. It is important that the metallic reinforcing layer 106 and the lower electrode 103 may be formed into an integrated structure, the electric field between the reinforcing layer 106 and the lower electrode 103 is equal and therefore there is no potential difference therebetween, and a piezoelectric effect is not produced in a part "sandwiching" the piezoelectric layer 104, which ensures that the designs or structures of the reinforcing layer 106 do not introduce parasitic effects and spurious signals, thereby not affecting the performance of a resonator device.

In a further embodiment, the reinforcing layer 106 is made of one or more of tungsten, iridium, molybdenum, titanium, chromium, copper, magnesium, silver, aluminium, gold or ruthenium, and the reinforcing layer 106 made of the above single metal or alloy has high hardness, which allows the reinforcing layer 106 to have a superior reinforcing effect. The above material is preferably a material for the electrode. If the material of the reinforcing layer 106 is the same as that of the electrode, the reinforcing layer 106 and the upper electrode 105 may be manufactured simultaneously in the same process step, to save costs.

Figure 8:
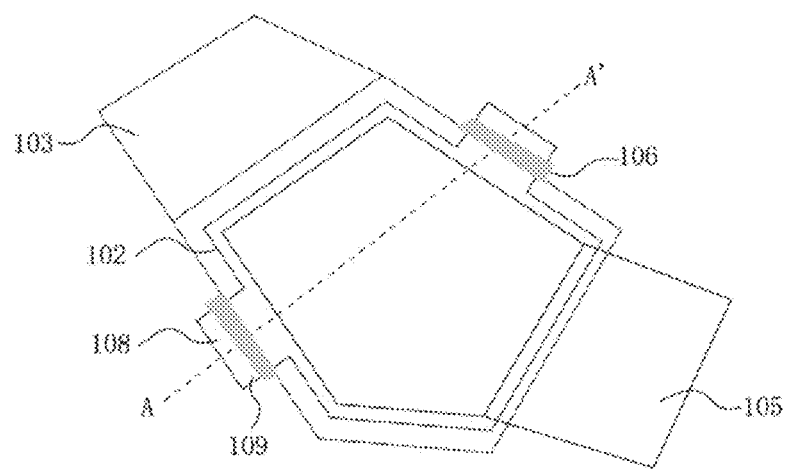
FIG. 8 is a top view of a reinforcing layer of an acoustic resonator according to an embodiment of the present disclosure.

In a further embodiment, as shown in FIG. 8, the reinforcing layer 106 has a polygonal shape in cross-section in a direction parallel to a surface of the substrate 101. since the reinforcing layer 106 has a polygonal shape in the cross-section in the direction parallel to the surface of the substrate 101, the strength of overall mechanical structure of the resonant functional layer near the edge of the opening 111 is further enhanced.

Figure 9:
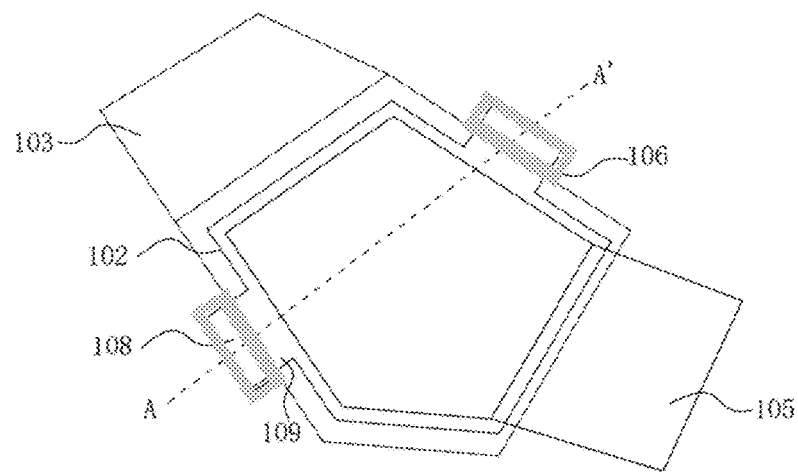
FIG. 9 is a top view of a reinforcing layer of an acoustic resonator according to an embodiment of the present disclosure.

In a further embodiment, as shown in FIG. 9, a release hole 108 is formed where the opening 111 is in communication with the release channel 109 and the cavity 110, and the reinforcing layer 106 may surround the release hole 108. Specifically, a central part of the annular-shaped reinforcing layer 106 is provided with a hollow portion, which is arranged above the release hole 108, and the reinforcing layer 106 surrounds an entire peripheral area of the release hole 108 to form an annular shape, thereby realizing the reinforcement of the reinforcing layer 106 in the entire peripheral area of the release hole 108.

Figure 10:
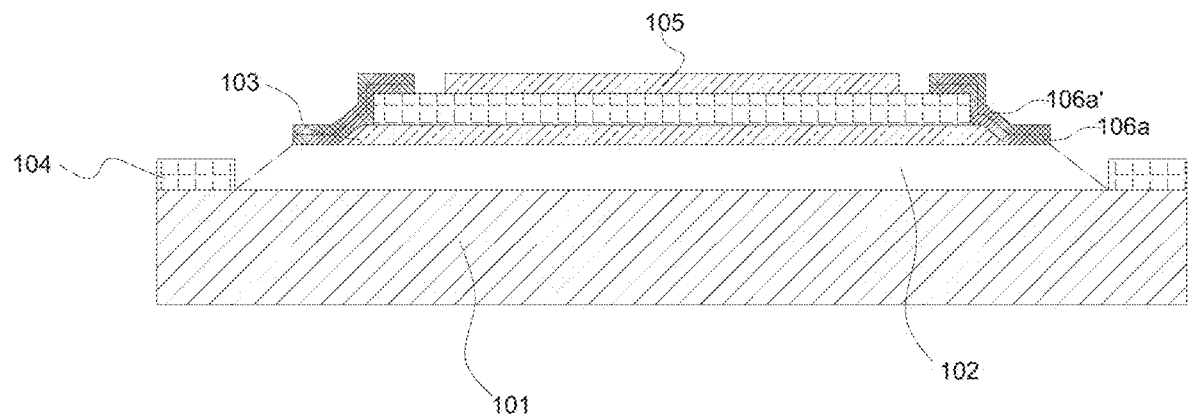
FIG. 10 is a schematic view illustrating the structure of a reinforcing layer of an acoustic resonator with a reinforcing structure according to an embodiment of the present disclosure.

In a further embodiment, the reinforcing layer 106 includes a laminated double-layered structure and at least one layer of the double-layered structure is made of a material with high hardness. In a case that the reinforcing layer 106 is made of the same material as that of the electrodes, the reinforcing layer 106 is highly conductive. In a case that the reinforcing layer 106 does not have high hardness, a layer of structure made of a material with high hardness is added to further enhance the stabilizing and supporting effects of the reinforcing layer 106. In a specific example, as shown in FIG. 10, the reinforcing layer 106 includes a double-layered structure of high hardness material layer 106a and high conductivity material layer 106a' laminated each other, and the double-layered structure is made of different materials, where the material for the high hardness material layer 106a is preferably tungsten, iridium, molybdenum, titanium, chromium, copper, magnesium, silver, aluminium, gold or the above metals or alloys thereof, or the like. The material for the high conductivity material layer 106a' is preferably silver, copper, gold, aluminium, magnesium, molybdenum, iridium, tungsten, chromium, titanium, or the like, or an alloy thereof or the like. In other embodiments, the reinforcing layer 106 may be made of non-metallic materials, which are not particularly limited here.

Figure 11:
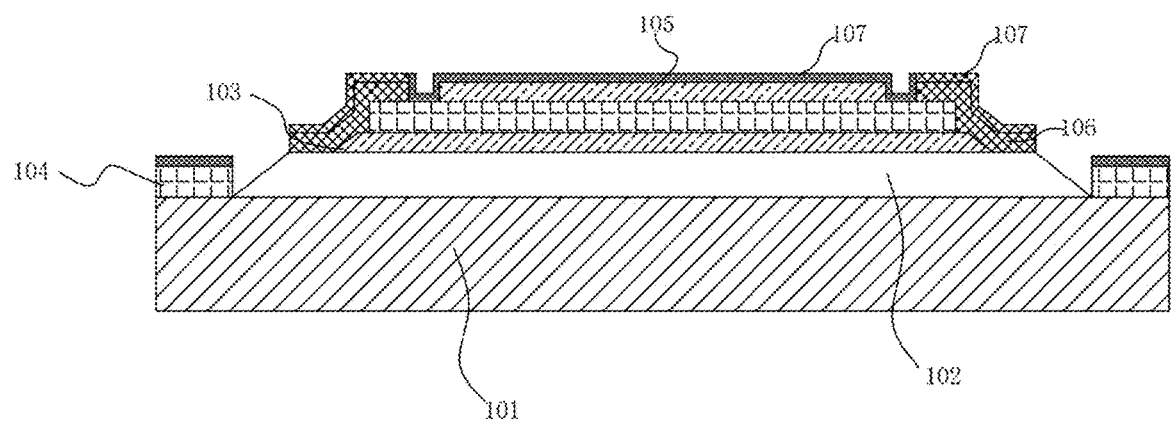
FIG. 11 is a schematic view illustrating the structure of a reinforcing layer of an acoustic resonator with a reinforcing structure according to an embodiment of the present disclosure.

In a further embodiment, as shown in FIG. 11, a passivation layer 107 is covered on the reinforcing layer 106 and the upper electrode 105, and the passivation layer 107 covers a gap between the reinforcing layer 106 and the upper electrode 105. The passivation layer 107 protects a surface of the resonator from oxidation and increases the service life of the resonator. The addition of the passivation layer 107 on the reinforcing layer 106 also serves to enhance the stabilizing and supporting effects of the reinforcing layer 106. In this case, there is no need to form other materials on the reinforcing layer 106, saving process steps. The passivation layer 107 may be not added on the reinforcing layer 106 in a case that the reinforcing layer 106 has a good stabilizing and supporting effects.

Figure 12:
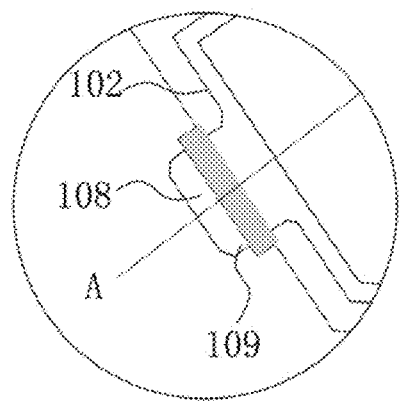
FIG. 12 is a schematic view illustrating the structure of a release channel of an acoustic resonator with a reinforcing structure according to an embodiment of the present disclosure.

In a further embodiment, with reference to FIG. 12, corners of the release hole 108 are obtuse at the edge near the peripheral area of the resonator. With the corners of the release hole 108 at the edge near the peripheral area of the resonator being obtuse additional stress generated in the corners may be reduced, thereby reducing the effect of a change in stress of the corners on a change in stress of the piezoelectric layer 104.

Figure 13:
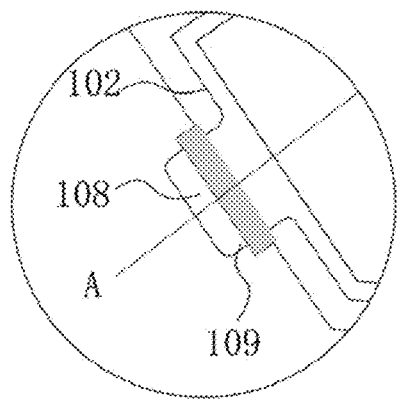
FIG. 13 is a schematic view illustrating the structure of a release channel of an acoustic resonator with a reinforcing structure according to an embodiment of the present disclosure.

In a further embodiment, with reference to FIG. 13, corners of the release channel 109 are arc-shaped at the edge near the peripheral area of the resonator. With the corners of the release channel 109 at the edge near the peripheral area of the resonator being arc-shaped, the additional stress generated in the corners may be reduced, thereby reducing the effect of a change in stress of the corners on a change in stress of the piezoelectric layer 104.

Figure 14:
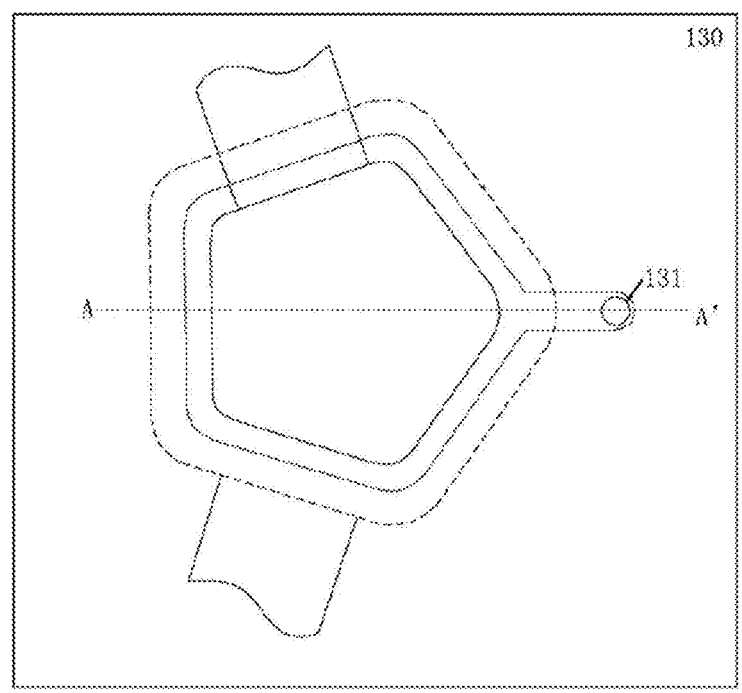
FIG. 14 is a schematic view illustrating the structure of an acoustic resonator in the conventional technology.

The above embodiment also has the following effects. In the conventional technology, the release hole is generally arranged on the piezoelectric layer, and the release hole is etched when being released to be in communication with the sacrificial layer. As shown in FIG. 14, a patent with a publication number CN111342809A refers to that a distance S1 of a release hole 131 from a lower electrode is equal to about 1 micron to 3 microns, and since a dielectric constant of air is much lower than a dielectric constant of the piezoelectric material, a path of electrostatic breakdown is more likely to extend along the release hole 131. That is, the cross-section of the piezoelectric layer is exposed after the piezoelectric layer is etched, and the exposed cross-section becomes a weakest point of the material susceptible to electrostatic breakdown since the etching causes the crystal structure of the material to be fractured at the cross-section. As a result, under certain circumstances, charges between the upper electrode and the lower electrode may be conducted through the air, causing the piezoelectric layer to be broken through by high voltage static electricity (e.g. 3000V) from the fractured cross-section, resulting in a device failure, i.e. the resonator's performance of anti-electrostatic breakdown, which can affect the yield control and operating life of device in a production process. In the present technical solution, as shown in FIG. 2, the lower electrode 103 and the reinforcing layer 106 form a "sandwiching" effect on the piezoelectric layer 104 at the end of a resonant region, with the reinforcing layer 106 covering the cross-section of the piezoelectric layer 104 from above the piezoelectric layer 104 and connecting to the lower electrode 103, thus protecting the entire cross-section. The piezoelectric layer 104 between the reinforcing layer 106 and the upper electrode 105 has no risk of electrostatic breakdown since there is no fractured cross-section.

Figure 15:
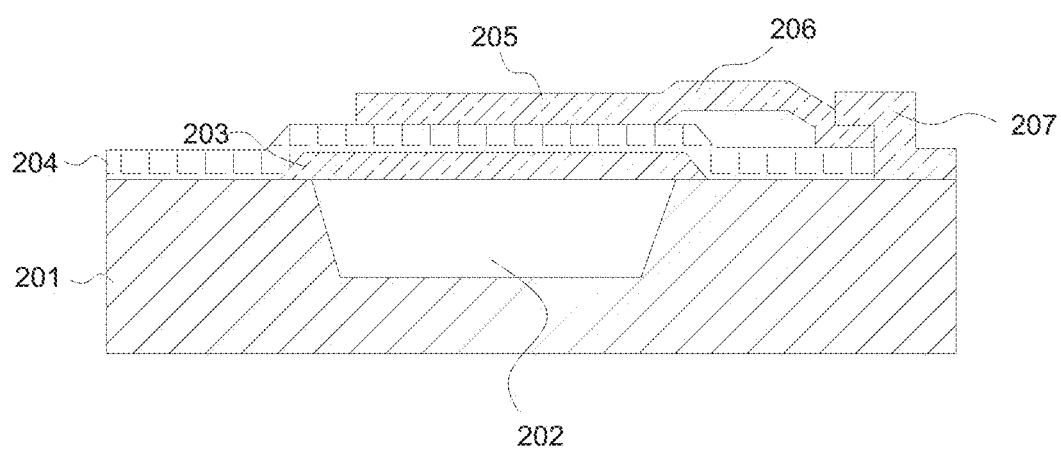
FIG. 15 is a schematic view illustrating the structure of an acoustic resonator in the conventional technology.
Figure 16:
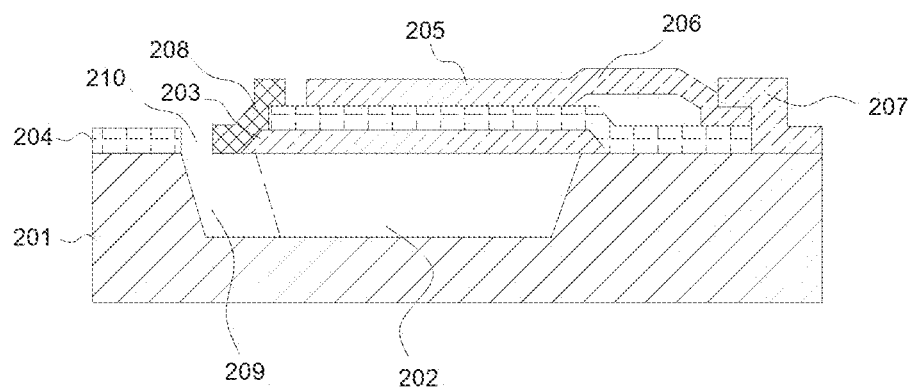
FIG. 16 is a schematic view illustrating a modified structure of an acoustic resonator of FIG. 15.

The reinforcing layer structure in the present disclosure is also applicable to any structure with a release hole in the conventional technology. By way of example, as shown in FIG. 15, in a patent with a publication number CN1019313808B, a resonator includes a substrate 201, a cavity 202, a lower electrode 203, a piezoelectric layer 204, an upper electrode 205, a bridge portion 206 and a contact portion 207. The cavity 202 of the resonator in practice is also formed by releasing a sacrificial material. The structure with a reinforcing layer being added is shown in FIG. 16, where a release hole 210 passes through the piezoelectric layer 204 to be in communication with a release channel 209, allowing the sacrificial material to be released. The addition of the reinforcing layer 208 to the structure of the conventional technology also reinforces the strength of the overall mechanical structure around the release hole and the release channel.

With reference to FIG. 17a to FIG. 17g, a method of manufacturing an acoustic device with a reinforcing structure is further provided according to an embodiment of the present disclosure. The manufacturing method includes steps S1 to S6.

In step S1, a substrate is provided.

In step S2, a sacrificial layer for forming a cavity is manufactured on the substrate.

Figure 17A:
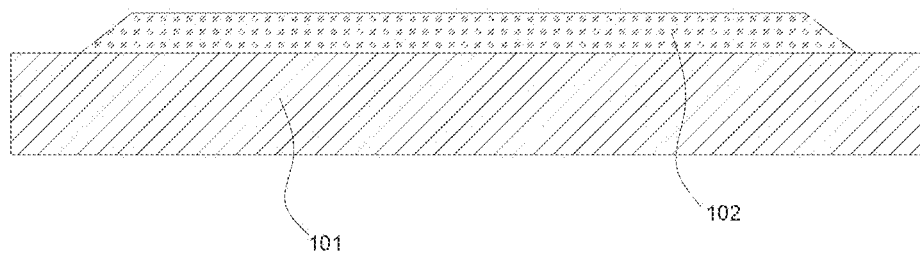
FIG. 17a to FIG. 17g each is a schematic flowchart of a method for manufacturing an acoustic device with a reinforcing structure according to the present disclosure.

In a specific embodiment, as shown in FIG. 17a, step S2 specifically includes the steps of: depositing a sacrificial material on the substrate 101, patterning the sacrificial material to form a sacrificial layer 102. In an example, CMP (chemical mechanical polishing) is performed on the sacrificial layer 102. The material for the substrate 101 is preferably Si/sapphire/spinel or the like, and the material for the sacrificial layer 102 is preferably PSG (i.e. P-doped $SiO_2$).

It will be appreciated that in different embodiments (not shown in the figures), it is also possible to manufacture the sacrificial layer, in which the cavity is to be formed, on the substrate 101 by firstly manufacturing a groove in the substrate 101 and then filling the groove using the sacrificial material.

In step S3, a lower electrode and a piezoelectric layer are formed in sequence on the substrate on which the sacrificial layer is formed.

Figure 17B:
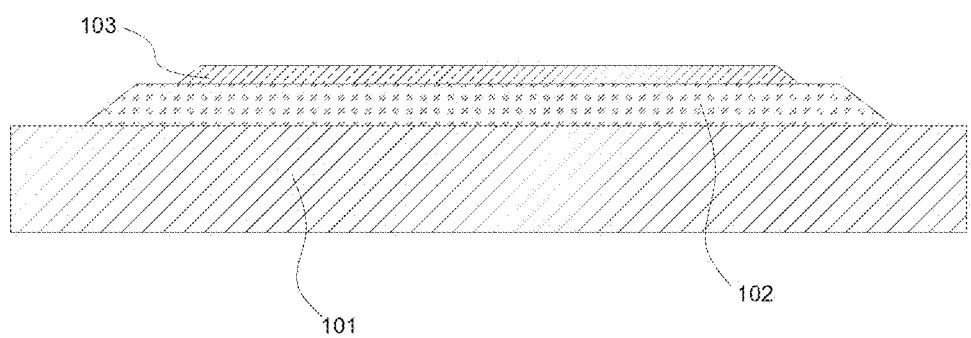
Figure 17C:
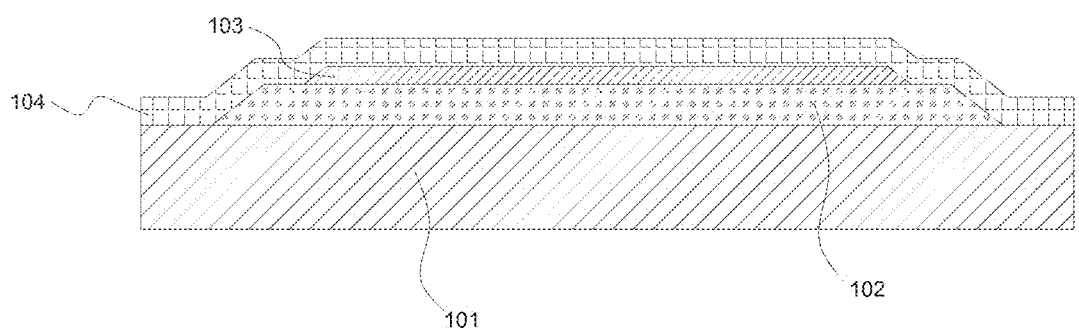

In a specific embodiment, with reference to FIG. 17b to FIG. 17c, step S3 specifically includes the steps S31 to S32.

In step S31, a lower electrode 103 is manufactured on the sacrificial layer 102 by a sputtering, photolithography or etching process, where the material for the lower electrode 103 is preferably Mo, as shown in FIG. 17b.

In step S32, a piezoelectric layer 104 is grown on the lower electrode 103 such that the piezoelectric layer 104 covers the lower electrode 103, the sacrificial layer 102 and the substrate 101, as shown in FIG. 17c.

In step S4, an opening is formed in the piezoelectric layer to expose part of the lower electrode such that the opening is in communication with the sacrificial layer.

Figure 17D:
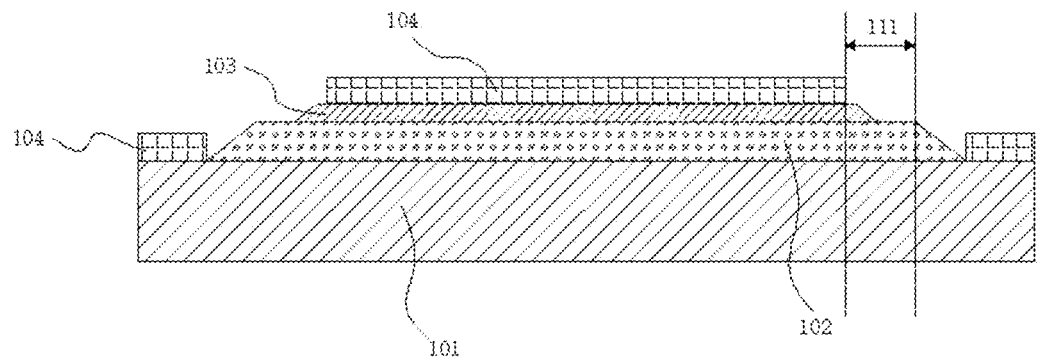

In a specific embodiment, with reference to FIG. 17d, step S4 specifically includes: etching the piezoelectric layer 104 to expose part of an edge of the lower electrode 103 and part of the sacrificial layer 102 near the edge of the lower electrode 103 to form openings 111 and 108, where a release hole 108 is formed where each of the openings is in communication with the sacrificial layer 102, and part of the edge of the lower electrode 103 is exposed in the opening 111.

In step S5, an upper electrode and a reinforcing layer are manufactured on the piezoelectric layer, part of the reinforcing layer is formed at the edge of the opening with being fitted to the edge, to reinforce the resonant functional layer near the edge of the opening.

Figure 17E:
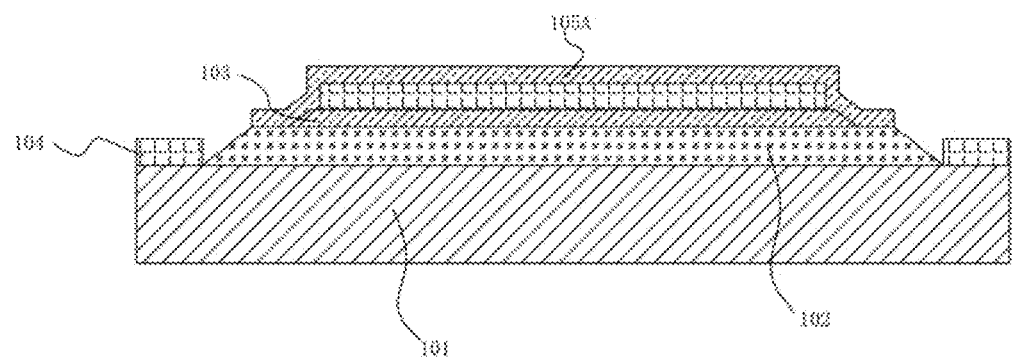
Figure 17F:
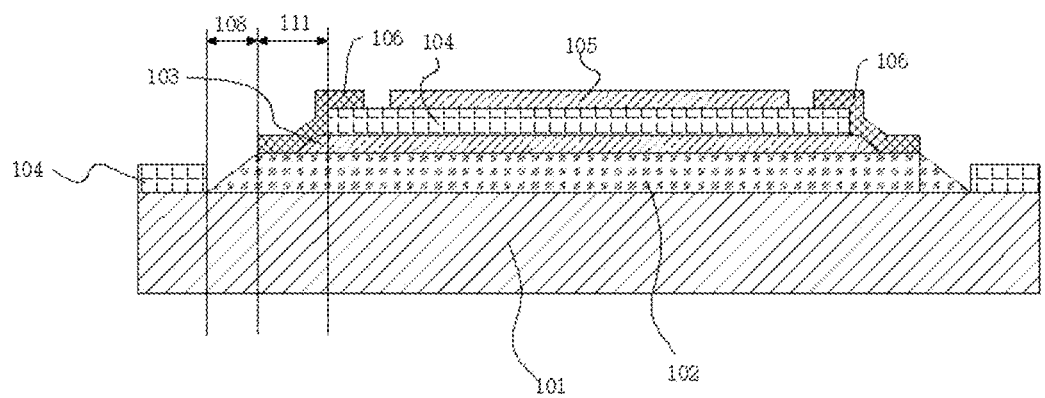

In a specific embodiment, with reference to FIG. 17e to FIG. 17f, step S5 specifically includes steps S51 to S52.

In step S51, an electrode material layer 105A is manufactured on the piezoelectric layer 104 by a sputtering, photolithography or etching process, such that the electrode material layer 105A covers the part of the lower electrode 103 and the part of the sacrificial layer 102 that is exposed in the piezoelectric layer 104, as shown in FIG. 17e.

In step S52, the part of the electrode material layer 105A which extends, towards an effective region of the acoustic resonator, from the edge of the opening 111 to a position above the piezoelectric layer 104 is separated from the remaining part of the electrode material layer 105A, to form the reinforcing layer 106.

As shown in FIG. 17f, the reinforcing layer 106 covers the part of the lower electrode 103 exposed in the opening 111 and reinforces the piezoelectric layer 104 near the opening 111, part of the reinforcing layer 106 further covers part of the piezoelectric layer 104, and the part of the electrode material layer 105A being retained severs as the upper electrode 105. The upper electrode 105 and the reinforcing layer 106 are preferably spaced greater than 2 microns apart to ensure that there is no risk of electrical connection therebetween.

In step S6, the sacrificial layer is released to form the cavity.

Figure 17G:
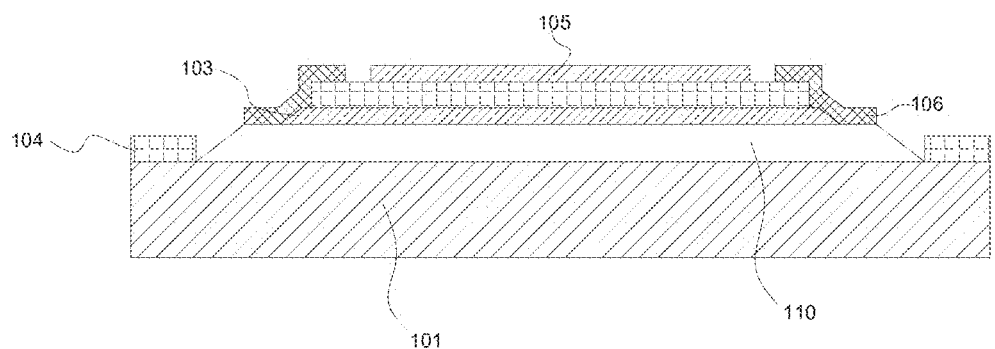

In a specific embodiment, as shown in FIG. 17g, step S6 specifically includes the step of releasing the sacrificial layer 102 by means of, for example, a hydrofluoric acid etchant, in order to expose the cavity 110.

Although the principles of the disclosure have been described in detail above in connection with preferred embodiments of the disclosure, it should be understood by those skilled in the art that the above embodiments are merely an explanation of a schematic implementation of the disclosure and are not a limitation on the scope of the disclosure. The details in the embodiments do not constitute a limitation of the scope of the present disclosure, and any equivalent transformation, simple replacement and other obvious variations based on the technical solution of the present disclosure, without departing from the spirit and scope of the present disclosure, fall within the scope of protection of the present disclosure.

The invention claimed is:

1. An acoustic resonator with a reinforcing structure, comprising:
   a substrate; and
   a resonant functional layer formed above the substrate, the resonant functional layer comprising:
     a lower electrode, wherein a cavity is formed between the lower electrode and the substrate;
     an upper electrode, arranged above the lower electrode; and
     a piezoelectric layer, arranged between the lower electrode and the upper electrode, wherein an opening passing through the piezoelectric layer is formed in a peripheral area of the piezoelectric layer, and the opening is in communication with the cavity;
   wherein the reinforcing structure comprises a reinforcing layer, and a part of the reinforcing layer is formed in the opening;
   wherein in the opening, the lower electrode is in contact with the reinforcing layer, and a bottom surface of the lower electrode is isolated from the reinforcing layer; and
   wherein the reinforcing layer is configured to reinforce the resonant functional layer near the edge of the opening.

2. The acoustic resonator with a reinforcing structure according to claim 1, wherein the lower electrode is in contact with the reinforcing layer at an edge of the lower electrode.

3. The acoustic resonator with a reinforcing structure according to claim 1, wherein the reinforcing layer extends onto an upper surface of the piezoelectric layer from the edge of the opening.

4. The acoustic resonator with a reinforcing structure according to claim 3, wherein an extended part of the reinforcing layer is spanned on the piezoelectric layer on at least two sides of the opening.

5. The acoustic resonator with reinforcing structure according to claim 3, wherein an extended part of the reinforcing layer extends, towards a center of the resonator, onto the piezoelectric layer from the edge of the opening.

6. The acoustic resonator with a reinforcing structure according to claim 2, wherein the reinforcing layer covers a surface of the edge.

7. The acoustic resonator with a reinforcing structure according to claim 1, wherein the reinforcing layer is made of a metallic material or a non-metallic material.

8. The acoustic resonator with a reinforcing structure according to claim 7, wherein the reinforcing layer is made of one or more of tungsten, iridium, molybdenum, titanium, chromium, copper, magnesium, silver, aluminium, gold or ruthenium.

9. The acoustic resonator with a reinforcing structure according to claim 1, wherein the reinforcing layer and the upper electrode are physically separated from each other.

10. The acoustic resonator with a reinforcing structure according to claim 9, wherein a gap at least greater than 2 microns exists between the reinforcing layer and an edge of the upper electrode.

11. The acoustic resonator with a reinforcing structure according to claim 1, wherein the reinforcing layer has a polygonal shape in cross-section in a direction parallel to a surface of the substrate.

12. The acoustic resonator with a reinforcing structure according to claim 1, wherein at least one side of the cavity is provided with a release channel in communication with the cavity, a release hole is formed where the opening is in communication with the release channel, and the reinforcing layer surrounds the release hole.

13. The acoustic resonator with a reinforcing structure according to claim 1, wherein the reinforcing layer comprises a laminated double-layered structure.

14. The acoustic resonator with a reinforcing structure according to claim 13, wherein at least one layer of the double-layered structure is made of a material with high hardness.

15. The acoustic resonator with a reinforcing structure according to claim 1, wherein a passivation layer is covered on the reinforcing layer and the upper electrode, and the passivation layer covers a gap between the reinforcing layer and the upper electrode.

16. The acoustic resonator with a reinforcing structure according to claim 12, wherein a projection of at least one corner of the release channel in a direction perpendicular to a surface of the substrate is obtuse or arc-shaped.

17. A method for manufacturing an acoustic device with a reinforcing structure, comprising:
    providing a substrate; and
    providing a resonant functional layer above the substrate, the resonant functional layer comprising:
        a lower electrode, wherein a cavity is formed between the lower electrode and the substrate;
        an upper electrode, arranged above the lower electrode; and
        a piezoelectric layer, arranged between the lower electrode and the upper electrode,
        wherein an opening passing through the piezoelectric layer is formed in a peripheral area of the piezoelectric layer, and the opening is in communication with the cavity;
        wherein the reinforcing structure comprises a reinforcing layer, and a part of the reinforcing layer is formed in the opening; and
        wherein in the opening, the lower electrode is in contact with the reinforcing layer, and a bottom surface of the lower electrode is isolated from the reinforcing layer; and
    wherein the reinforcing layer is configured to reinforce the resonant functional layer near the edge of the opening.

18. The method according to claim 17, wherein the reinforcing layer further covers part of the piezoelectric layer.

19. The method according to claim 17, wherein the reinforcing layer and the upper electrode are formed simultaneously using a metallic material, and the reinforcing layer and the upper electrode are separated from each other.

20. The method according to claim 17, wherein providing a resonant functional layer above the substrate comprises:
    manufacturing, on the substrate, a sacrificial layer for forming the cavity;
    forming the lower electrode and the piezoelectric layer in sequence on the substrate with the sacrificial layer;
    forming the opening in the piezoelectric layer to expose a part of the lower electrode, wherein the opening is in communication with the sacrificial layer;
    manufacturing the upper electrode and the reinforcing layer on the piezoelectric layer, wherein the part of the reinforcing layer is fitted to the edge; and
    releasing the sacrificial layer to form the cavity.

* * * * *